United States Patent
Shizuno

(10) Patent No.: US 7,566,638 B2
(45) Date of Patent: Jul. 28, 2009

(54) METHOD OF DICING A SEMICONDUCTOR DEVICE INTO PLURAL CHIPS

(75) Inventor: Yoshinori Shizuno, Kanagawa (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 18 days.

(21) Appl. No.: 11/239,154

(22) Filed: Sep. 30, 2005

(65) Prior Publication Data
US 2006/0082003 A1    Apr. 20, 2006

Related U.S. Application Data

(62) Division of application No. 10/730,101, filed on Dec. 9, 2003, now abandoned.

(30) Foreign Application Priority Data
Jul. 10, 2003    (JP)    ............................. 2003/194873

(51) Int. Cl.
*H01L 21/00* (2006.01)
(52) U.S. Cl. .................. 438/463; 438/460; 438/462; 438/464; 257/E21.001
(58) Field of Classification Search ......... 438/455–465; 257/E21.001
See application file for complete search history.

(56) References Cited

U.S. PATENT DOCUMENTS

| | | | |
|---|---|---|---|
| 4,729,971 A * | 3/1988 | Coleman | 438/462 |
| 5,742,094 A | 4/1998 | Ting | |
| 6,136,668 A * | 10/2000 | Tamaki et al. | 438/462 |
| 6,303,470 B1 | 10/2001 | Ohsumi et al. | |
| 6,420,776 B1 * | 7/2002 | Glenn et al. | 257/620 |
| 6,562,698 B2 * | 5/2003 | Manor | 438/460 |
| 6,657,282 B2 | 12/2003 | Fukasawa et al. | |
| 6,734,083 B2 * | 5/2004 | Kobayashi | 438/462 |
| 6,849,524 B2 * | 2/2005 | Shelton et al. | 438/465 |
| 6,992,026 B2 * | 1/2006 | Fukuyo et al. | 438/797 |
| 7,091,624 B2 * | 8/2006 | Iijima et al. | 257/797 |
| 7,183,136 B2 * | 2/2007 | Hashimura et al. | 438/113 |
| 2002/0005568 A1 | 1/2002 | Kikuchi | |
| 2002/0025655 A1 | 2/2002 | Satoh et al. | |
| 2003/0127428 A1 * | 7/2003 | Fujii et al. | 216/65 |
| 2003/0216010 A1 * | 11/2003 | Atlas | 438/462 |
| 2005/0202596 A1 | 9/2005 | Fukuyo et al. | |
| 2006/0148212 A1 * | 7/2006 | Fukuyo et al. | 438/463 |

FOREIGN PATENT DOCUMENTS

| | | |
|---|---|---|
| JP | 52-149478 | 12/1977 |
| JP | 11-177137 | 7/1999 |
| JP | 2002-192370 | 7/2002 |
| JP | 2004-1076 | 1/2004 |

* cited by examiner

*Primary Examiner*—Alexander G Ghyka
*Assistant Examiner*—Angel Roman
(74) *Attorney, Agent, or Firm*—Volentine & Whitt, P.L.L.C.

(57) ABSTRACT

A semiconductor device includes a substrate, a seal layer which seals a semiconductor element formed on the substrate, wherein a side surface of the seal layer is positioned inside of a side surface of the substrate.

12 Claims, 8 Drawing Sheets

METHOD OF DICING A SEMICONDUCTOR DEVICE INTO PLURAL CHIPS

CROSS REFERENCE TO RELATED APPLICATIONS

This is a divisional application of application Ser. No. 10/730,101 filed Dec. 9, 2003, now abandoned which is hereby incorporated by reference in its entirety for all purposes.

BACKGROUND OF THE INVENTION

1. Field of the Invention

The present invention relates to a semiconductor device and method of a manufacturing the same.

This application is counterpart of Japanese patent applications, Serial Number 194873/2003, filed Jul. 10, 2003, the subject matter of which is incorporated herein by reference.

2. Description of the Related Art

A dicing method using a rotating blade has heretofore been used upon individualizing a wafer such as a silicon substrate in which semiconductor elements or the like are formed and built in a wafer process, into a plurality of pieces of chips.

The dicing method using the blade is used even in a case in which a wafer subsequent to an external terminal forming process is individualized in a WCSP (Waferlevel Chip Size Package) manufacturing process.

In recent years, attention has been given to a device provided with an SOS (Silicon On Sapphire) substrate in which a silicon thin film is formed on a sapphire layer, in terms of low power consumption and speeding up.

However, the sapphire constituting the SOS substrate is high in hardness next to the diamond. Therefore, when dicing is effected on the sapphire substrate, it is performed in a state in which the rotational speed of a blade is held extremely low (at a rotational speed equivalent to a few one-tenth to one-hundredth the normal rotational speed) or a dicing method using laser light is used.

A method using thermal fusion by laser light has heretofore been utilized as the dicing method using the laser light. However, it has many problems to be solved, such as thermal distortion, contamination, etc.

To this end, a non-heated processing system (or also called non-fusion system) has recently been proposed as a new laser light-based dicing method. Described specifically, there are known a stealth dicing method (see the following Patent Document 1, for example) developed by Hamamatsu Photonics KK, and a shortpulse laser developed by Disco Co., Ltd.

(Patent Document 1)

Japanese Laid Open Patent Application No. 2002-192370

However, when the above-mentioned dicing method using the blade is utilized, there is a need to set a margin ranging from several tens of μm to several hundreds of μm rather than a chip size. This is because a kerf width produced upon dicing, pitching developed by impact of dicing, etc. must be taken into consideration.

Therefore, a chip size larger than an actual chip size must be designed. Thus, since the collected number of chips per wafer decreases, the cost of each product increases.

When the SOS substrate is used in particular, a long period of time is required for dicing because the sapphire substrate is a grinding resistant material, and this is another issue to consider in addition to kerf width and dicing. As a result, the blade is wasted earlier, thus causing a substantial increase in cost.

Similarly even in the case of WCSP, a package size must be designed larger than an actual package size, thus increasing the product cost.

On the other hand, when the above non-heated processing system (or also called non-fusion system) is utilized, the kerf width and pitching are almost undeveloped and high-speed dicing is made possible as compared with the dicing method using the blade.

However, the non-heated processing type dicing involves the following problems.

A permeability resistant portion hard to cause laser light to pass therethrough might be interposed in a laser optical path upon application of the laser light to a target to be processed.

At this time, the rate of convergence of the laser light into the target is reduced due to the fact that the execution of dicing becomes impossible or the laser light is scattered over the surface of the target. As a result, a remarkable kerf width and pitching might be developed.

As such a permeability resistant portion, may be mentioned, for example, a metal film for a process monitoring TEG, a seal layer at a WCSP, etc. all provided on a dicing line of a wafer.

With an increase in demand for high integration of a recent semiconductor device, the practical application of a thinned silicon substrate or the like is urgently necessary. Since, however, the kerf width and pitching become noticeable with substrate's thinning, many technical problems arise under existing circumstances.

Therefore, an object of the present invention is to provide a semiconductor device which makes it possible to apply non-fusion type dicing using laser light regardless of a structural form of a target to be processed, thereby to suppress the occurrence of a kerf width and pitching, and a manufacturing method thereof.

SUMMARY OF THE INVENTION

According to one aspect of the present invention, there is provided a semiconductor device which includes a substrate, a seal layer which seals a semiconductor element formed on the substrate, wherein a side surface of the seal layer is positioned inside of a side surface of the substrate.

According to another aspect of the present invention, there is provided a method of manufacturing a semiconductor device, wherein the target to be processed is cut into plural pieces along a line to cut the target, which includes grinding a surface of the target; and applying a laser light to the exposed surface of the target to cut the target along the line.

According to the above method, wherein the target includes a first layer and a second layer that makes it harder than the first layer to cause the laser light to pass therethrough, and the second layer is removed by grinding.

According to the above method, wherein the target includes a first layer and a second layer that makes it harder than the first layer to cause the laser light to pass therethrough, and the grinding is applied to a surface of the first layer.

According to the above method, wherein the whole thickness of the first layer is thinned in the grinding.

According to the above method, wherein a surface of the second layer is fixed onto an elastic sheet, and after the applying the laser light, the sheet is extended to perform the cutting.

According to the above method, after the applying the laser light, further including grinding from the surface of the second layer to a surface of the first layer.

According to the above method, wherein the target is ground by grinding means having a surface to which diamond fine grains are fixed.

According to the above method, wherein the average grain diameter of the diamond falls within a range of 4 μm to 10 μm.

According to the above method, wherein the applying the laser light is a non-heated type process in which the laser light is focused inside the target.

According to the above method, wherein the surface of the target is smoothed in the grinding.

According to the above method, wherein the first layer of the target includes a substrate formed with a semiconductor element, and the second layer thereof includes a seal layer for sealing the semiconductor element provided on the substrate.

According to the above method, wherein the first layer of the target includes a substrate formed with a semiconductor element, and the second layer thereof includes a metal layer.

According to the above method, wherein the substrate is a silicon substrate or a sapphire substrate whose surface is formed with a silicon thin film.

According to yet another aspect of the present invention, there is provided a method of manufacturing a semiconductor device having a target, wherein the target to be processed is cut into plural pieces, which includes grinding a surface of the target; and applying a laser light to a ground surface of the target to cut the target.

According to the above method, wherein the grinding is applied to the whole surface of the target to thin the whole thickness of the target.

According to the above method, wherein the grinding is applied to part of the surface of the target.

According to the above method, wherein the applying the laser light is a non-heated type process in which the laser light is focused inside the target.

According to yet another aspect of the present invention, there is provided a method of manufacturing a semiconductor device, which includes preparing a target which includes a first layer and a second layer formed on the first layer, wherein the second layer makes it harder than the first layer to cause laser light to pass therethrough; grinding the second layer, and applying the laser light to a exposed surface of the first layer, which is exposed by the grinding the second layer, to cut the target.

According to the above method, wherein the grinding the second layer includes grinding a part of the surface of the first layer, following the grinding of the second layer.

According to yet another aspect of the present invention, there is provided a method of manufacturing a semiconductor device, which includes preparing a target which includes a first layer and a second layer formed on the first layer, wherein the second layer makes it harder than the first layer to cause laser light to pass therethrough; grinding the first layer; and applying the laser light to a grinded surface of the first layer to cut the target.

According to the above method, wherein the grinding the first layer is applied to the whole surface of the first layer to thin the whole thickness of the target.

According to the above method, wherein the applying the laser light is a non-heated type process in which the laser light is focused inside the first layer.

The above and further objects and novel features of the invention will more fully appear from the following detailed description, appended claims and the accompanying drawings.

DETAILED DESCRIPTION OF THE PREFERRED EMBODIMENTS

Figure 1A:
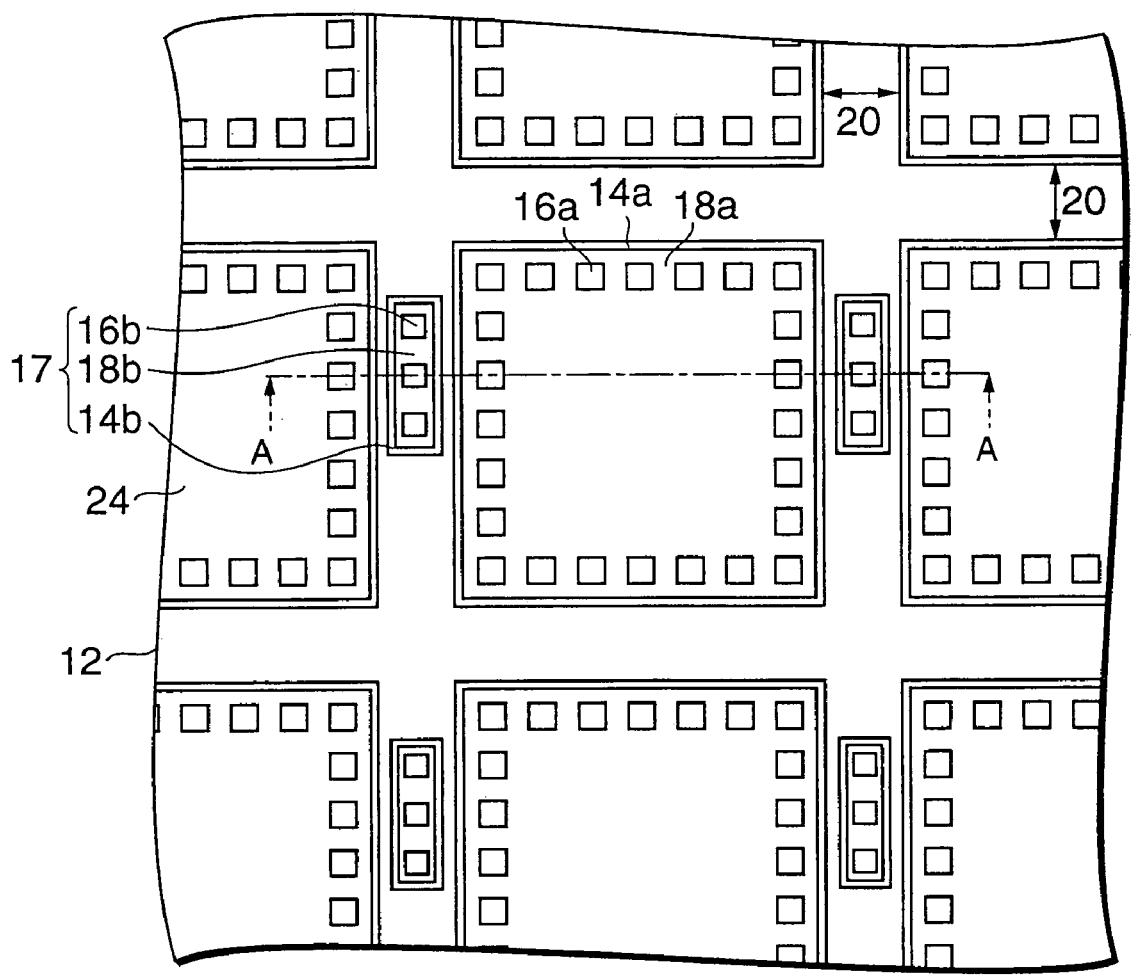
FIG. 1(A) is a schematic plan view showing part of a wafer prior to being diced into semiconductor devices and FIG. 1(B) illustrates a configuration of a light irradiation device in relation to a target, according to a first embodiment of the present invention.

Embodiments of the present invention will hereinafter be explained with reference to FIGS. 1(A) through 8(C). Incidentally, the respective drawings schematically show one configurational examples of semiconductor devices according to the present invention. Also the respective drawings simply schematically illustrate shapes, sizes of respective components and their layout relationships to the extent of making it possible to understand the present invention. The present invention is by no means limited to these illustrated examples. In order to make it easy to understand the drawings, hatchings (i.e., oblique lines) indicative of cross-sections are omitted except for parts. Although particular materials and conditions or the like might be used in the following description, these materials and conditions are nothing but one preferred example. Accordingly, no limitations are imposed on them. Similar components illustrated in the respective drawings are respectively identified by the same reference numerals, and the description of certain common components might be omitted.

First Preferred Embodiment

A semiconductor device according to a first embodiment of the present invention and its manufacturing method will be explained with reference to FIGS. 1(A) through 2(D). FIG. 1(A) is a plan view schematically showing part of a wafer prior to being diced into the semiconductor devices according to the present embodiment FIG. 2(A) is a cross-sectional view as seen in the direction indicated by arrows in the drawing, of a cut area (i.e., a cross-section) obtained by cutting FIG. 1(A) along an alternate long and short dash line A-A FIGS. 1(B) through 2(D) are cross-sectional views following FIG. 2(A), for describing the semiconductor devices each according to the present embodiment and the manufacturing method thereof.

The method of manufacturing the semiconductor device according to the present embodiment will be explained below.

Figure 2A:
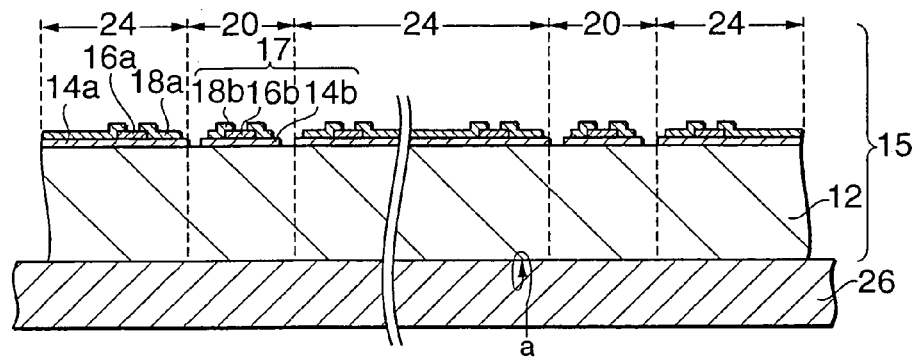
FIGS. 2(A) through 2(D) are process diagrams for describing a process for manufacturing the semiconductor device according to the first embodiment of the present invention.

As shown in FIG. 2(A), a laminated body 15 after the completion of a wafer process is first prepared as a target to be processed. A plurality of effective chip areas 24 to be individualized via a subsequent dicing process are disposed in the laminated body 15 in a matrix form. Incidentally, the three effective chip areas 24 are illustrated in FIG. 2(A) by way of example to avoid complication of the drawing. Incidentally, the laminated body 15 is also referred to as a wafer.

Further, a dicing area 20 necessary for dicing every effective chip areas 24 is formed on the surface of the laminated body 15 with being placed between the adjacent effective chip areas 24 in a predetermined width.

The laminated body 15 employed in the present embodiment is provided with a first layer 12, and permeability-resistant second layers 17 hard to allow laser light to pass therethrough as compared with the first layer 12.

Each of the second layers 17 constitutes a process monitoring TEG (Test Element Group) provided in the dicing area 20. The TEG is an evaluating circuit for each process contained in the wafer process. In recent years, the TEGs are often formed in the dicing area 20 with a view toward increasing the collected number of chips per wafer.

The first layer 12 employed in the present configurational example is a silicon (Si) substrate.

Each of the second layers 17 employed in the present configurational example comprises an electrode pad 16b, a silicon oxide film 14b and a passivation film 18b, which are formed over the silicon substrate 12 in the dicing area 20. Since the electrode pad 16b has permeability resistance hard to allow the laser light to pass through the silicon substrate 12 in the dicing area 20, the electrode pad 16b might be referred to as a permeability resistant portion below.

Described specifically, the electrode pad 16b made of aluminum is formed in the dicing area 20 via the silicon oxide film 14b provided on the silicon substrate 12. The passivation film 18b made up of a silicon nitride film is formed on the silicon oxide film 14b so as to expose the surfaces of the electrode pads 16b.

Incidentally, the permeability resistant portion is not limited only to a metal layer portion of each electrode pads 16b included in TEG. Thus, when, for example, a metal wiring layer for wafer burn-in is formed in the dicing area 20 instead of each TEG, the metal wiring layer may be configured as the permeability resistant portion.

On the other hand, electrode pads 16a made of aluminum are formed over the silicon substrate 12 of the effective chip area 24 via a silicon oxide film 14a formed on the silicon substrate 12. A passivation film 18a made up of a silicon nitride film is formed on the silicon oxide film 14a so as to expose the surfaces of the electrode pads 16a.

A back surface a of the silicon substrate 12 of the laminated body 15 is fixed onto a dicing tape 26 used as a seet. As the dicing tape 26, one can be used which is obtained by applying an ultraviolet curing acrylic resin used as an adhesive material to the surface of a base material made of polyolefine.

Figure 2B:
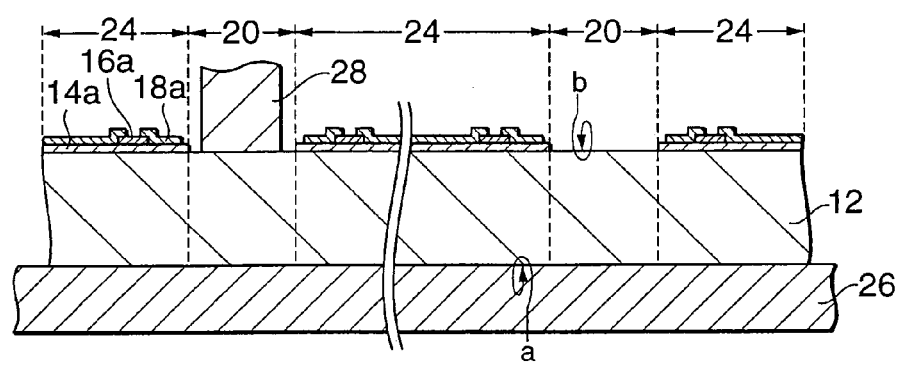

Subsequently, as a first grinding process as shown in FIG. 2(B), the second layers 17 are removed by grinding to thereby expose the silicon substrate 12 corresponding to the first layer in the dicing area 20.

That is, the first grinding process according to the first embodiment principally aims to remove the electrode pads 16b each corresponding to the permeability resistant portion placed over the silicon substrate 12 of the dicing area 20 in the laminated body 15. In general, the silicon oxide films 14b and the passivation films 18b are used to cause the laser light to pass therethrough. However, the selective removal of each electrode pad 16b is complex in practice. Further, the silicon oxide films 14 and passivation films 18b may preferably be removed simultaneously in consideration of much smoothness of the dicing area 20 and easiness of individualizing processing at the dicing process.

The first grinding process is done using, for example, a high-speed rotated blade as grinding means. It is preferable to use blades ranging from the #600 (index indicative of mesh coarseness) blade to which such diamond fine grains that grains diameters thereof lying within a range of 20 μm to 30 μm have a majority at the outer peripheral portion of a metal-made disk, are fixed, to the #2000 blade to which such diamond fine grains that grain diameters thereof lying within a range of 4 μm to 6 μm have a majority, are fixed.

It is also preferable to use the #1500 blade to which such diamond fine grains that grain diameters thereof lying within, more preferably, a range of 5 μm to 10 μm have a majority, are fixed. The blades to which the fine-grained diamonds are fixed, are capable of improving smoothness of a surface to be ground or polished, whereas blade dogging becomes a problem. Thus, the average grain diameter of the diamond is set as for the blade to which such diamond fine grains that the grain diameters thereof lying within the range of 5 μm to 10 μm have the majority, are fixed, in terms of these. This is because it is preferable in practice.

Described specifically, a blade 28 which is rotated at high speed about its axis and to which such diamond fine grains that the grain diameters thereof lying within the range of 5 μm to 10 μm have the majority, are fixed, is pressed against the electrode pads 16b in the dicing area 20. Then the blade 28 is moved toward the silicon substrate 12 while predetermined pressure is being applied thereto along the dicing area 20. A cut-in depth of the blade at this time is gradually rendered deep so as to reach a depth at which the passivation film 18 and the silicon oxide film 14b are removed starting with the electrode pads 16b each corresponding to the permeability resistant portion. The silicon substrate 12 in the dicing area 20 is exposed in this way. Incidentally, at least the electrode pads 16b may be removed in the first grinding process. To this end, the cut-in depth of the blade 28 can arbitrarily and suitably be set but may be set to such an extent that the surface layer of the silicon substrate 12 in the dicing area 20 is slightly ground within its allowable range. Thus, this is because the removal of the second layers 17 (14b, 16b and 18b) is needless to say realized and the smoothing of the surface b of the silicon substrate 12 in the dicing area 20 can be realized together with its removal. By arbitrarily and suitably setting grinding conditions, the surface b of the silicon substrate 12 subsequent to the first grinding process can also be brought into a mirror surface.

Figure 2C:
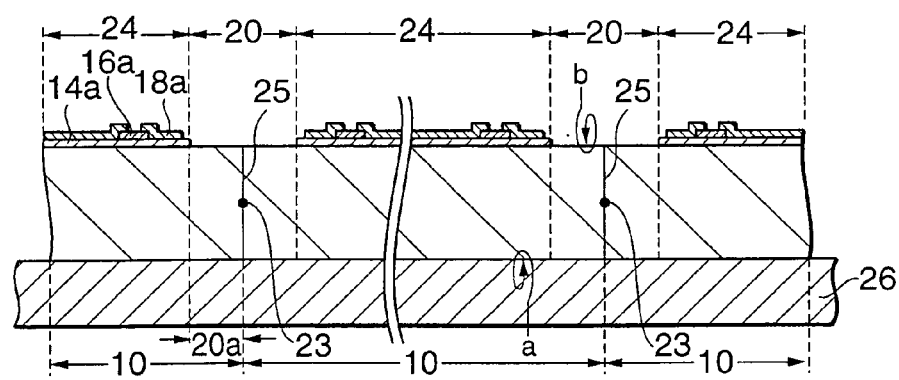
Figure 2D:
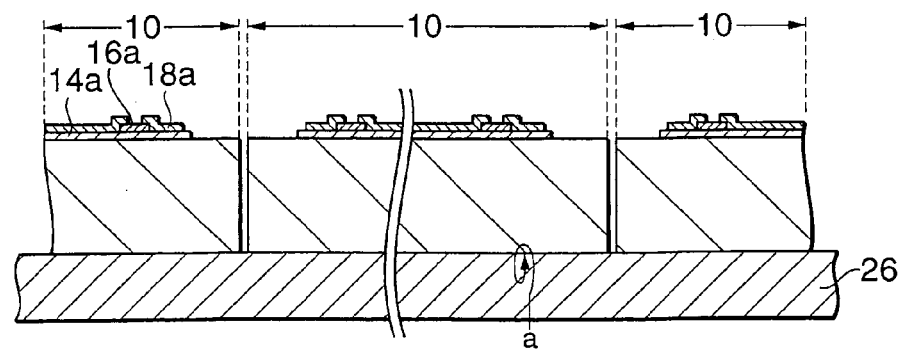

Subsequently, as shown in FIG. 2(C), a dicing process for cutting targets to be processed by laser light is performed. The present embodiment will explain non-fusion type (or also referred to as a non-heated processing type) laser dicing by way of illustration.

In the present embodiment, upon execution of the non-fusion type laser dicing, it is carried out assuming that as irradiation conditions for laser light, for example, a light source is a YAG laser, the wavelength of the laser light is 1064 mn, and the sectional area of a laser light spot is $3.14 \times 10^{-8}$ cm². The alignment at the irradiation of the laser light is enabled by observing it through an infrared camera because the infrared rays pass through the silicon substrate 12. Incidentally, the irradiation conditions for the laser light are not limited to the above alone but can be arbitrarily and suitably set according to purposes and design.

Described specifically, the laser light is applied to the inside of the silicon substrate 20 exposed to the dicing area 20 along the dicing area 20 while a converging point of the laser light is being focused.

Figure 1B:
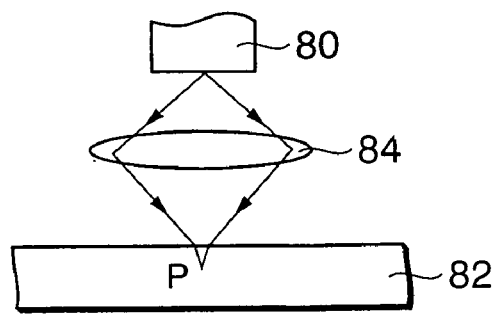

One example of a laser light irradiation device at this time is a configuration in which a condenser lens 84 is provided at a predetermined position between a laser light source 80 and a target 82 as shown in FIG. 1(B). According to such a configuration, the laser light can be selectively converged on an arbitrary portion of the target 82 as viewed in its depth direction by means of the condenser lens 82 (its converging point is indicated by P in the figure).

Upon execution of the dicing process, the electrode pads 16b initially formed in the dicing area 20 have already been removed in the first grinding process. Therefore, it is possible to suppress a reduction in the rate of convergence of the laser light into the silicon substrate 12 due to irregular reflection of the laser light in the dicing area 20 or scattering of the laser light over the surface of the silicon substrate 12.

In the present embodiment, modified portions 23 caused by multiple photon absorption are formed by the laser light converged inside the silicon substrate 12 with high accuracy. At this time, cracks 25 with the modified portions 23 as starting points are produced due to internal stress or distortion with the formation of the modified portions 23. Namely, since the cracks 25 are produced due to its occurrence, the modified portions 23 are also referred to as crack generation sources.

In the non-fusion type of the present embodiment, the laminated body per se is cut into chips 10 by the cracks 25 caused due to the modified portions 23 along the dicing area 20. Alternately, the laminated body comprising the effective chip areas 24 and dicing residual areas 20a can be cut into chips 10 respectively by use of the cracks 25.

Although the cracks 25 used in the present embodiment are described as through cuts which reach from the surface b of the silicon substrate 12 to the back surface a thereof, half cuts may be used which do not reach the back surface a of the silicon substrate. In the case of the half cuts, a new dicing process is further performed subsequently or the silicon substrate is bent, whereby the laminated body 15 can be cut into the individual chips 10 along the dicing area 20.

Thereafter, the respective cut chips are peeled away from the dicing tape 26.

The ultraviolet curing acrylic resin of the dicing tape 26 is irradiated with ultraviolet rays for curing. Thereafter, the base material is extended in a predetermined direction to define gaps between the adjacent chips 10 (see FIG. 2(D)). While this state is being maintained, the force is applied from the back surface of the dicing tape 26 to push up the individual chips 10, thereby peeling away semiconductor devices corresponding to the individual chips 10 from the dicing tape 26 (this process will be referred to as a peeling process below).

In the present embodiment, as is apparent from the above description, the first grinding process that aims to smooth the diced surface is performed as a pretreatment upon execution of the non-fusion type dicing process by laser.

Thus, even if the laser light is irregularly reflected on the diced surface or penetrated even into the silicon substrate upon the dicing process, a reduction in the rate of convergence of the laser light due to scattering of the laser light can be suppressed.

Therefore, the occurrence of a kerf width and pitching can be suppressed as compared with the case in which the individualization into the chips is done by only the dicing method using the blade as before.

As a result, since the margin for an actual chip size can be designed narrower than ever, the sizes of the individualized chips can be reduced.

With their reduction, the collected number of chips per wafer increases and hence a reduction in manufacturing cost can be expected.

Second Preferred Embodiment

A second embodiment of the present invention will be explained with reference to FIGS. 3(A) through 3(D), which are respectively cross-sectional views similar to FIGS. 2(A) through 2(D), for describing a semiconductor device according to the present embodiment and its manufacturing method. Incidentally, the same elements of structure as those already described in the first embodiment are respectively identified by the same reference numerals, and their specific description will be omitted (the following embodiments are also similar).

The present embodiment is principally different from the first embodiment in that a first grinding process is effected on a back surface a of a silicon layer 12 corresponding to a first layer.

Figure 3A:
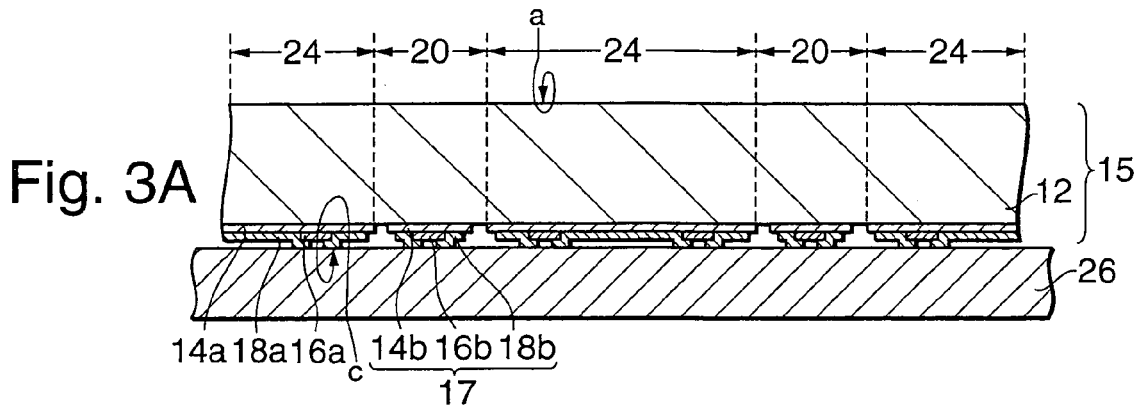
FIGS. 3(A) through 3(D) are process diagrams for describing a process for manufacturing a semiconductor device according to a second embodiment of the present invention.

First of all, as shown in FIG. 3(A), a top face c of each second layer 17 of the laminated body (wafer) 15 described in the first embodiment is fixed onto the dicing tape 26.

Thereafter, the grinding of the back surface a of the silicon substrate 12 is performed as the first grinding process.

The first grinding process employed in the present embodiment principally aims to thin the silicon substrate 12 and smoothen the surface (corresponding to the back surface a here) of the silicon substrate 12.

Figure 3B:
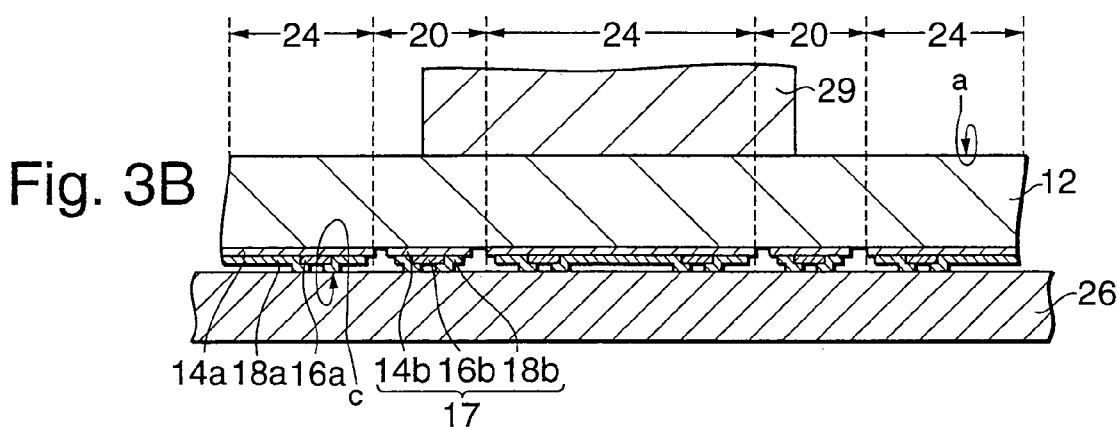

To this end, as shown in FIG. 3(B), the whole back surface a of the silicon substrate 12 is first ground while a grinding stone to which, for example, a relatively rough-grained diamond is fixed, is being rotated at high speed as grinding means, thereby setting the silicon substrate 12 to a predetermined thickness extent (first grinding). The rough-grained grinding stone is first used in consideration of shortening of the processing time and the like. Thereafter, the whole back surface a of the silicon substrate 12 is further ground by means of a grinding stone 29 to which diamond fine grains fine-grained as compared with the above grinding stone are fixed, thereby further thinning the thickness of the silicon substrate 12 (second grinding).

Owing to the first grinding process, the thinning of the silicon substrate is needless to say realized and the smoothing of the back surface a of the silicon substrate can be realized in conjunction with it. Since the second grinding is executed using the grinding stone fine-grained as compared with the first grinding, the back surface a of the silicon substrate subsequent to the first grinding process may be brought into a mirror surface. Incidentally, the grinding means employed in the present embodiment is not limited to the grinding stone. One capable of grinding the whole surface of the silicon substrate 12 can be arbitrarily and suitably selected.

Figure 3C:
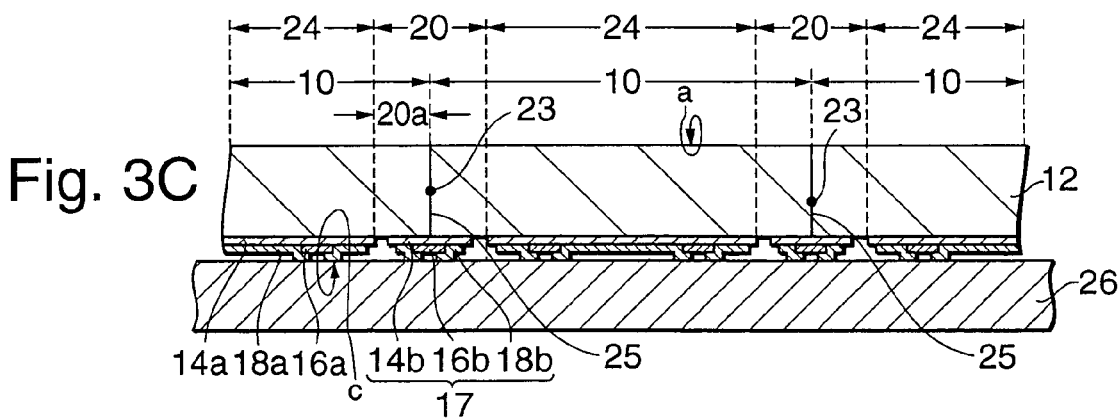

Subsequently, a non-fusion type dicing process is performed by a method similar to the method described in the first embodiment as a laser light-based dicing process (see FIG. 3(C)).

Upon execution of the dicing process, the back surface a of the silicon substrate 12 in the dicing area 20 has already been smoothed in the first grinding process. Therefore, it is possible to suppress a reduction in the rate of convergence of the laser light into a target to be processed due to irregular reflection of the laser light by the dicing area 20 or scattering of the laser light over the surface of the target to be processed.

Thus, modified portions 23 are formed inside the silicon substrate 12 by the laser light gathered with high accuracy, in a manner similar to the first embodiment. Then the laminated body (wafer) can be cut into chips 10 comprising effective chip areas 24 and dicing residual areas 20a respectively by use of cracks 25 with the modified portions 23 as starting points. Incidentally, since electrode pads 16b are respectively permeability resistant portions, second layers 17 remain in the dicing area 20 without the cutting thereof after the completion of the dicing process.

Figure 3D:
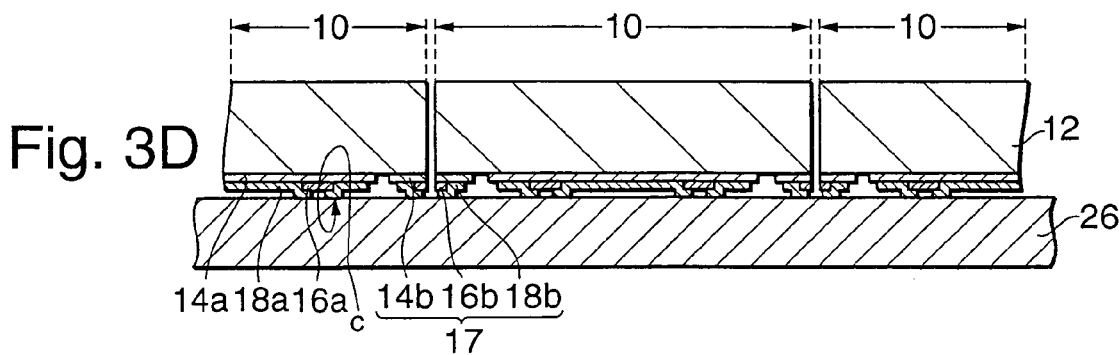

Afterwards, a peeling process for peeling away the respective cut chips from the dicing tape 26 by a method similar to the first embodiment is performed (see FIG. 3(D)).

In the peeling process according to the present embodiment, the dicing tape is extended in a predetermined direction to thereby mechanically bring the second layer 17 portions into destruction, whereby spaces or gaps can be formed between the adjacent chips 10.

As is apparent from the above description, the present embodiment is capable of obtaining an advantageous effect similar to the first embodiment.

Further, the smoothing of the surface of the silicon substrate and the thinning of the silicon substrate can be performed in conjunction with each other by the first grinding process employed in the present embodiment.

Therefore, the occurrence of a kerf width and pitching noticeable with respect to the thinned silicon substrate or the like can be suppressed in the dicing process.

Thus, according to the present embodiment, semiconductor devices having realized their thinning can be obtained with efficiency and stably.

Third Preferred Embodiment

A third embodiment of the present invention will be explained with reference to FIGS. 4(A) through 4(D), which are respectively cross-sectional views similar to FIGS. 2(A) through 2(D), for describing a semiconductor device according to the present embodiment and its manufacturing method.

The present embodiment is principally different from the first embodiment in that a first layer is configured as an SOS (Silicon On Sapphire) substrate 32 in which a silicon thin film 35 is formed on a sapphire layer 37. The SOS substrate 32 is a substrate formed by epitaxially growing the silicon thin film 35 corresponding to a single crystal on the sapphire substrate 37 by thermal decomposition of a silicon hydride ($SiH_4$) gas. Incidentally, since a structure other than the SOS substrate 32, of a laminated body 40 is similar to the first embodiment, its detailed description will be omitted.

Figure 4A:
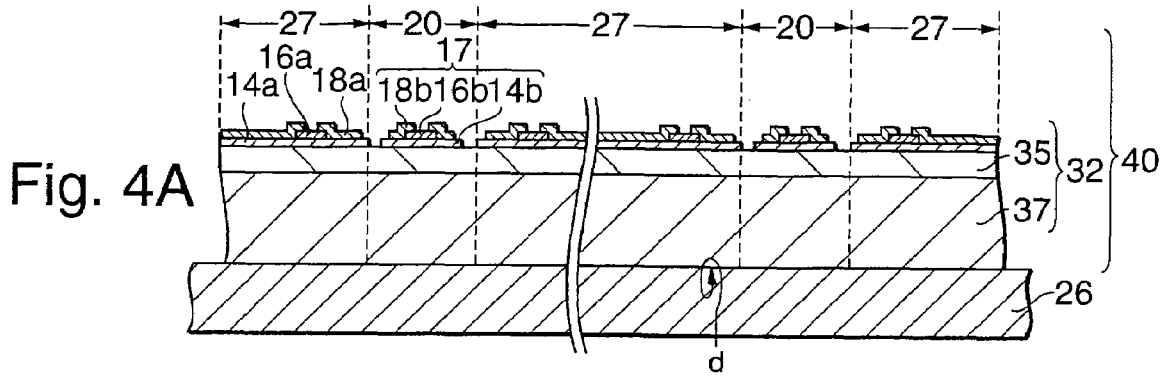
FIGS. 4(A) through 4(D) are process diagrams for describing a process for manufacturing a semiconductor device according to a third embodiment of the present invention.
Figure 4B:
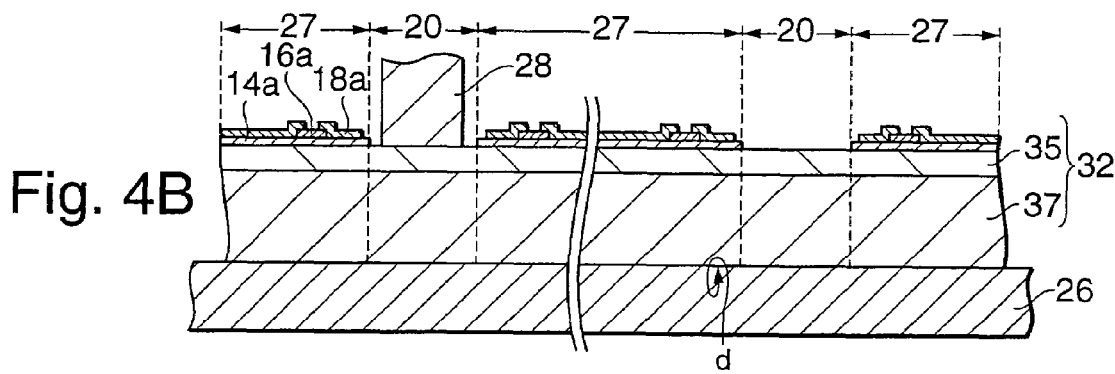
Figure 4C:
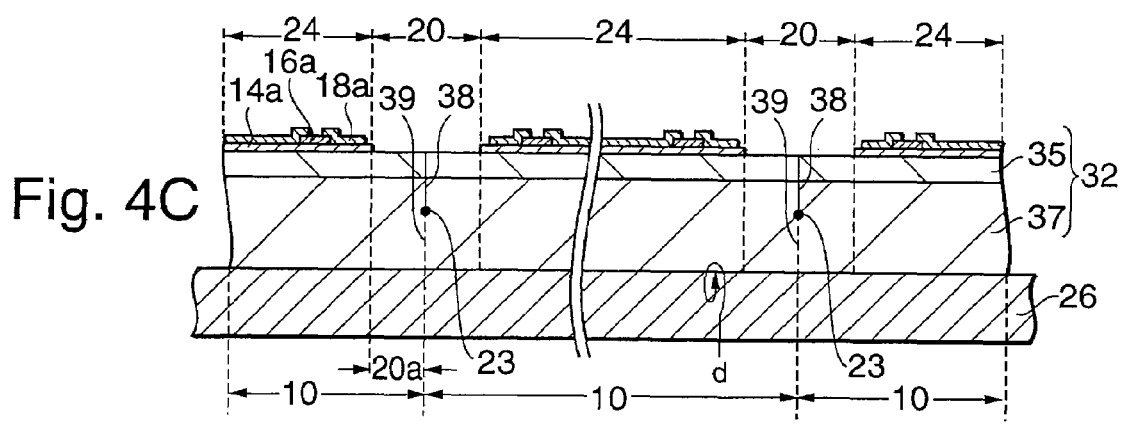

As shown in FIG. 4(A), a laminated body 40 after the completion of a wafer process is first prepared as a target to be processed. A plurality of chips 27 individualized via a subsequent dicing process are disposed in the laminated body 40 in a matrix form. Incidentally, three chips are illustrated in FIG. 4(A) by way of example to avoid complication of the drawing.

A back surface d of the sapphire substrate 37 of the laminated body 40 is fixed onto its corresponding dicing tape 26. Thereafter, a first grinding process and a laser light-based dicing process, i.e., a non-fusion type dicing process are executed in a manner similar to the first embodiment (see FIGS. 4(B) and 4(C)).

Therefore, modified layers 23 are formed even in the dicing process employed in the present embodiment. Since, however, the sapphire substrate 37 is of a grinding resistant material here, they are often formed as such half cuts that cracks 38 do not reach the back surface d of the sapphire substrate 37. In this case, it is preferable that a new dicing process is further performed to newly form cracks 39 and the laminated body 40 is cut along a dicing area 20. This is because mechanical destruction made for each chip is difficult upon a peeling process as in the second embodiment since the sapphire substrate is of the grinding resistant material.

Figure 4D:
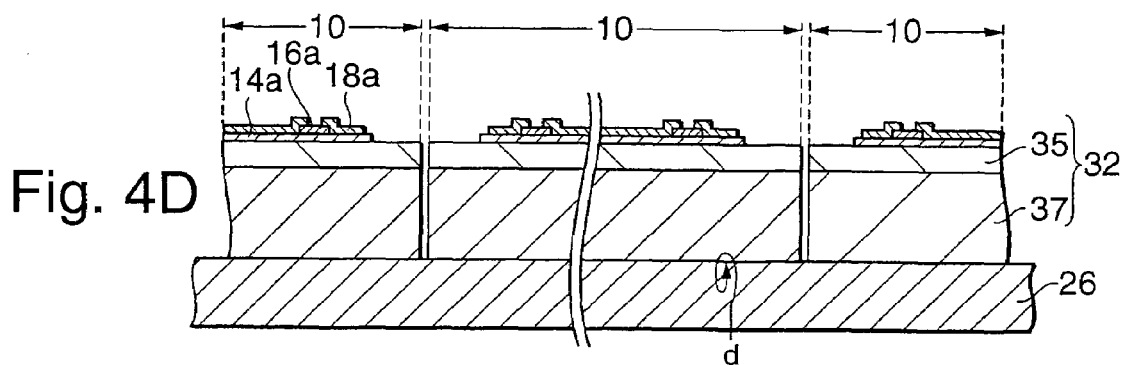

Subsequently, the peeling process for peeling away the respective cut chips from the dicing tape 26 is executed by a method similar to the first embodiment (see FIG. 4(D)).

As is apparent from the above description, the present embodiment is capable of obtaining an advantageous effect similar to the first embodiment.

Further, the time required to dice the target to be processed having the grinding resistant material like the sapphire substrate can greatly be shortened as compared with the case in which the dicing is performed by only the dicing method using the blade.

Thus, since the dicing having efficiency higher than ever can be realized, a reduction in manufacturing cost can be expected.

Fourth Preferred Embodiment

Figure 5:
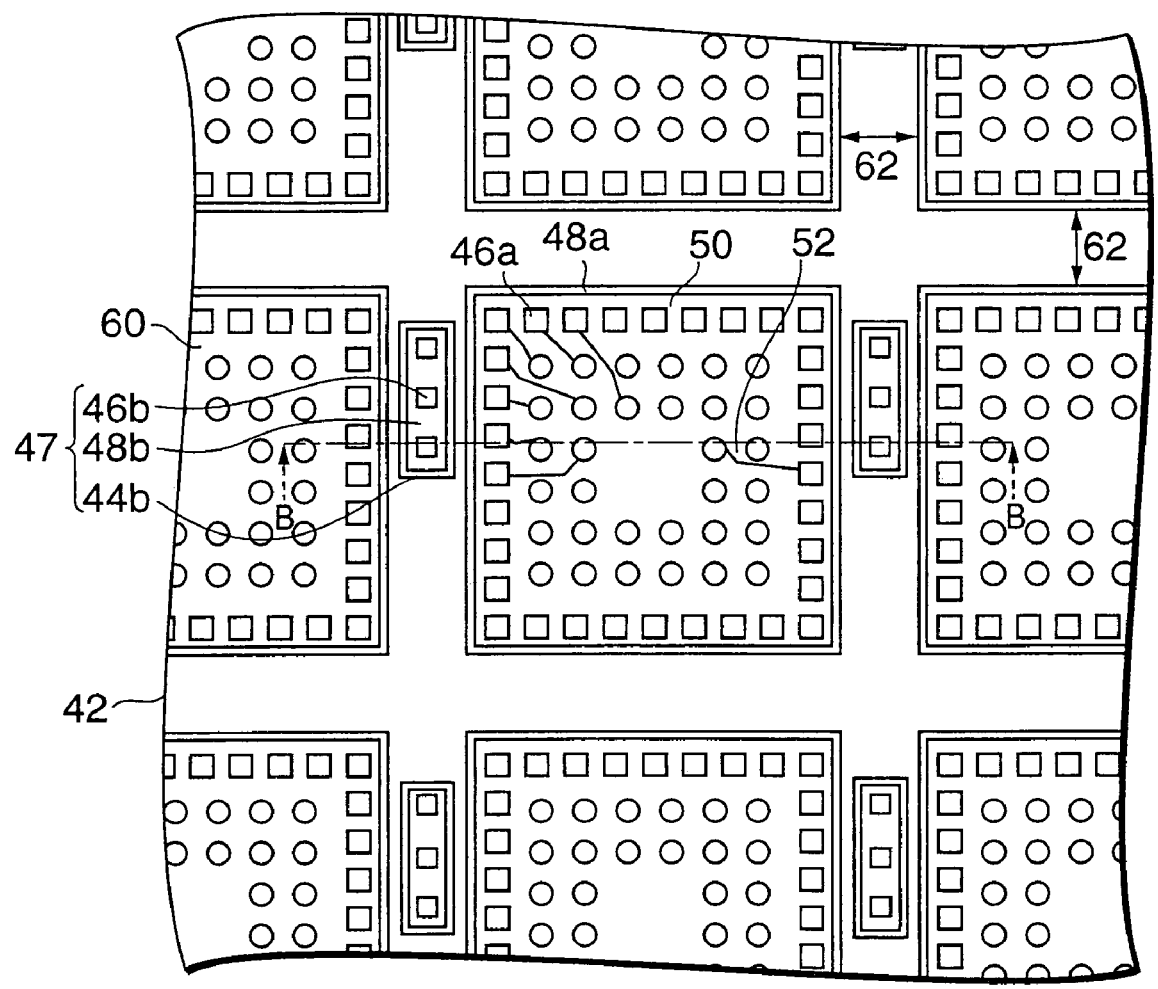
FIG. 5 is a schematic plan view illustrating part of a wafer prior to being diced into semiconductor devices each according to a fourth embodiment of the present invention.
Figure 6A:
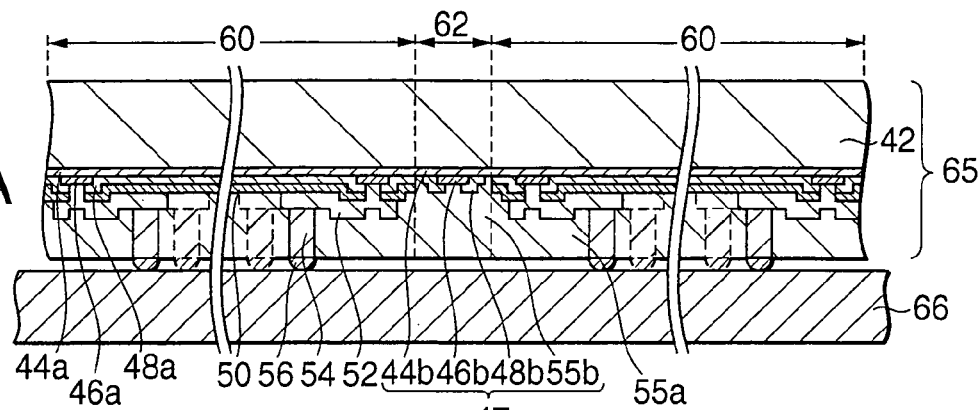
FIGS. 6(A) through 6(C) are process diagrams (part 1) for describing a process for manufacturing the semiconductor device according to the fourth embodiment of the present invention.

A semiconductor device according to a fourth embodiment of the present invention and its manufacturing method will be explained with reference to FIGS. 5 through 7(B). FIG. 5 is a plan view schematically showing part of a wafer prior to being diced into the semiconductor devices each according to the present embodiment. FIG. 6(A) is a cross-sectional view as seen in the direction indicated by arrows in the drawing, of a cut area (i.e., cross-section) obtained by cutting FIG. 5 along an alternate long and short dash line B-B. FIGS. 6(B) through 7(B) are respectively cross-sectional views following FIG. 6(A), for describing the semiconductor devices each according to the present embodiment and the manufacturing method thereof. The present embodiment will explain WCSP as one example with a target to be processed requiring a dicing process as a structure having a seal layer.

The method of manufacturing the semiconductor device according to the present embodiment will be explained below.

As shown in FIG. 6(A), a laminated body 65 subsequent to an external terminal forming process is first prepared as a target to be processed. A plurality of WCSP effective areas 60 to be individualized via a subsequent dicing process are disposed in the laminated body 65 in a matrix form. Incidentally, in the present embodiment, individual packages individualized from the wafer subsequent to the external terminal forming process will be explained with being referred to as WCSP. Three WCSP effective areas 60 are illustrated in FIG. 6(A) as one example to avoid complication of the drawing.

A dicing area 62 necessary for dicing into the WCSP effective areas 60 is formed on the surface of the laminated body 65 with being placed between the adjacent WCSP effective areas 60 in a predetermined width.

The laminated body 65 employed in the present embodiment includes a first layer 42, and permeability resistant second layers 47 hard to cause laser light to pass therethrough as compared with the first layer 42.

The first layer 42 employed in the present configurational example is a silicon substrate.

Each of the second layers 47 employed in the configurational example includes electrode pads 46b, a silicon oxide film 44b, a passivation film 48b and a seal layer 55b, which are formed over the silicon substrate 42 in the dicing area 62.

Each of the electrode pads 46b and seal layer 55b constituting the second layer 47 has permeability resistance hard to cause the laser light to pass through the silicon substrate 42 in the dicing area 62. Therefore, the electrode pads 46b and the seal layer 55b will be referred to as permeability resistant portions below.

Of the second layer 47, the electrode pads 46b, silicon oxide film 44b and passivation film 48b constitute a process monitoring TEG in a manner similar to the first embodiment. The seal layer 55b is formed so as to cover these electrode pads 46, silicon oxide film 44b and passivation film 48b. Incidentally, the description of its detailed structure is omitted since it is similar to the first embodiment.

On the other hand, electrode pads 46a made of aluminum are formed over the silicon substrate 42 lying in areas corresponding to the WCSP effective areas 60 with a silicon oxide film 44a formed on the silicon substrate 42 being interposed therebetween. A passivation film 48a made of a silicon nitride film and an insulating film 50 made of a polyimide film are sequentially formed over the silicon oxide film 44a so as to expose the surfaces of the electrode pads 46a. Further, the respective electrode pads 46a are respectively electrically and individually connected to post portions 54 via dedicated re-wiring layers 52. Incidentally, the rewiring layers 52 are respectively made of copper (Cu) and designed to provide the degree of freedom of wiring design. A seal layer 55a made of an epoxy resin is formed over the silicon substrate 42 with such a thickness that the end faces (or top faces) of the post portions 54 are exposed. External terminals 56 for connecting to a mounting board are formed on the post portions 54 respectively. Incidentally, sine the details of the structure of WCSP are already known, its detailed description will be omitted.

The external terminals 56 of the laminated body 65 are fixed onto a dicing tape 66.

Figure 6B:
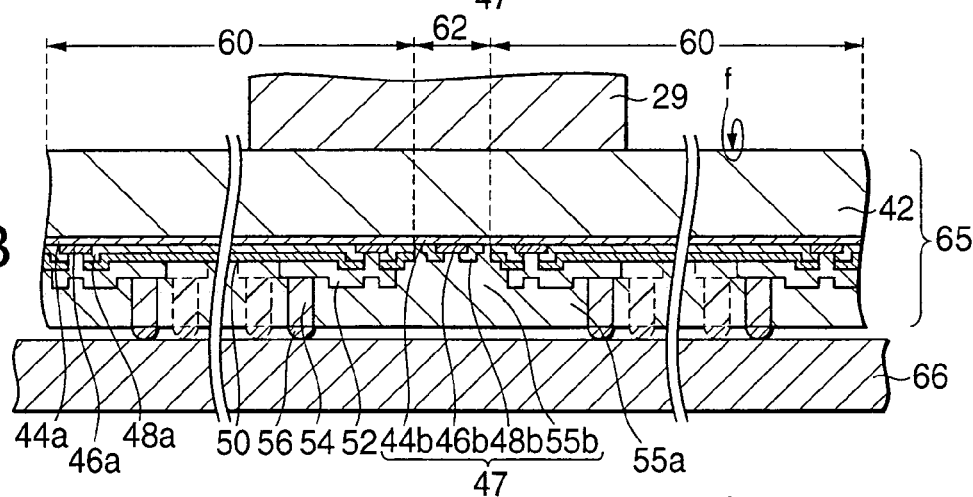

Subsequently, a first grinding process is performed as shown in FIG. 6(B).

The first grinding process executed here principally aims to thin the silicon substrate 42 and smoothen the surface (corresponding to a back surface f in the present embodiment) in a manner similar to the second embodiment.

Therefore, the first grinding process is performed even in the present embodiment in a manner similar to the first grinding process of the second embodiment to thereby carry out thinning and smoothing of the silicon substrate 42.

Figure 6C:
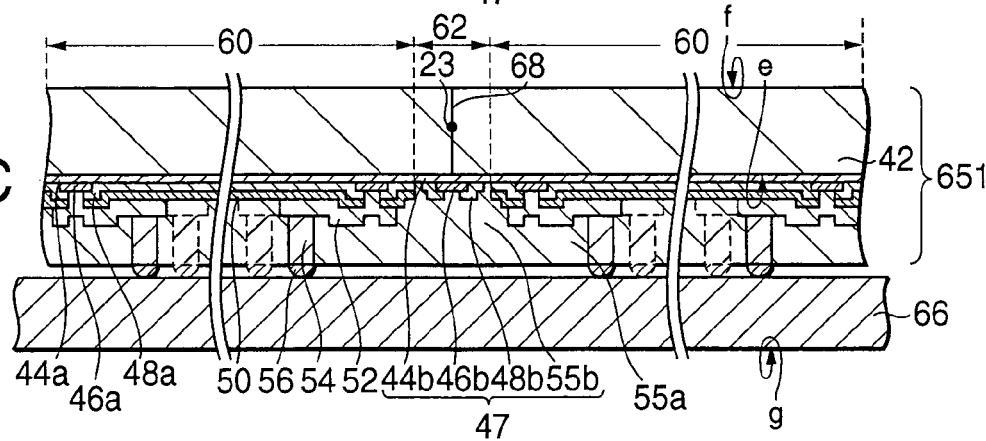

Subsequently, a non-fusion type dicing process is performed by a method similar to the method described in the first embodiment as a laser light-based dicing process (see FIG. 6(C)).

Upon execution of the dicing process, the back surface f of the silicon substrate 42 in the dicing area 62 has already been smoothed in the first grinding process. Therefore, it is possible to suppress a reduction in the rate of convergence of the laser light into a target to be processed due to irregular reflection of the laser light by the dicing area 62 or scattering of the laser light over the surface of the target to be processed.

Thus, modified portions 23 are formed inside the silicon substrate 42 by the laser light gathered with high accuracy, in a manner similar to the first embodiment. Then the silicon substrate 42 portion can be cut using cracks 68 with the modified portions 23 as starting points. Thus, a laminated body 651 including the cracks 68 and dicing residual areas 62a (see FIG. 7(A)) formed in the silicon substrate 42 is obtained on the dicing tape 66 along the dicing area 62. Incidentally, since the electrode pads 46b and seal layers 55b are respectively the permeability resistant portions, the second layers 47 remain in the dicing area 62 with the cutting thereof after the completion of the dicing process.

Thereafter, in the present embodiment, grinding is done from the surface of the seal layer 55b constituting the second layer 47 to a surface e face-to-face with the second layer 47, of the silicon substrate 42 corresponding to the first layer.

Thus, the back surface f of the silicon substrate 42 is first sucked by use of a vacuum suction device or a surface g of the dicing tape 66 is sucked by use of the vacuum suction device to thereby peel away the dicing tape 66 from the laminated body 651.

Figure 7A:
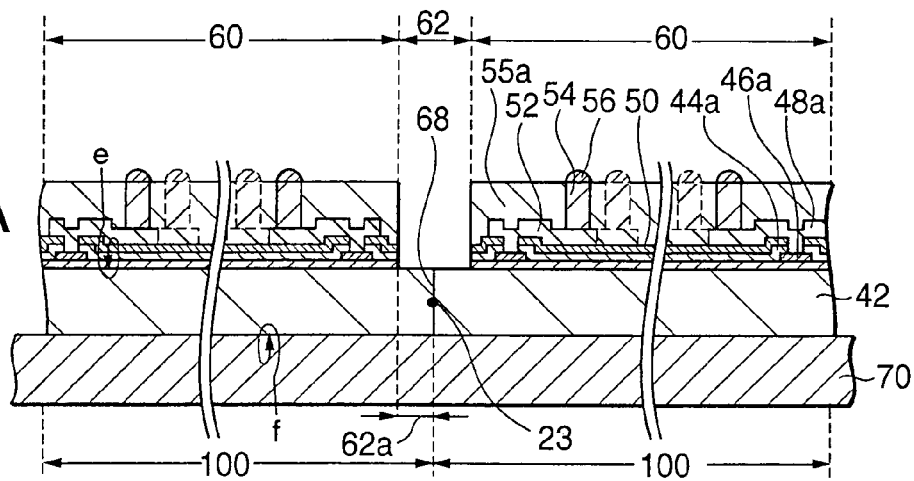
FIGS. 7(A) and 7(B) are process diagrams (part 2) for describing the process for manufacturing the semiconductor device according to the fourth embodiment of the present invention.

Next, as shown in FIG. 7(A), the back surface f of the silicon substrate 42 of the laminated body 651 is fixed onto a dicing tape 70.

Thereafter, as a second grinding process, a blade (not shown) rotated about its axis at high speed is pressed against the seal layers 55b in the dicing area 62 and moved toward the silicon substrate 42 while predetermined pressure is being applied thereto along the dicing area 62. A cut-in depth of the blade at this time is gradually rendered deep so as to reach a depth at which the silicon substrate 42 is exposed.

Thus, the silicon substrate can be cut into WCSPs 100 comprising WCSP effective areas 60 and dicing residual areas 62a. Incidentally, alignment at the second grinding process can be performed by, for example, forming marks at edge portions of the wafer which are not formed with the seal layers (55a and 55b).

Figure 7B:
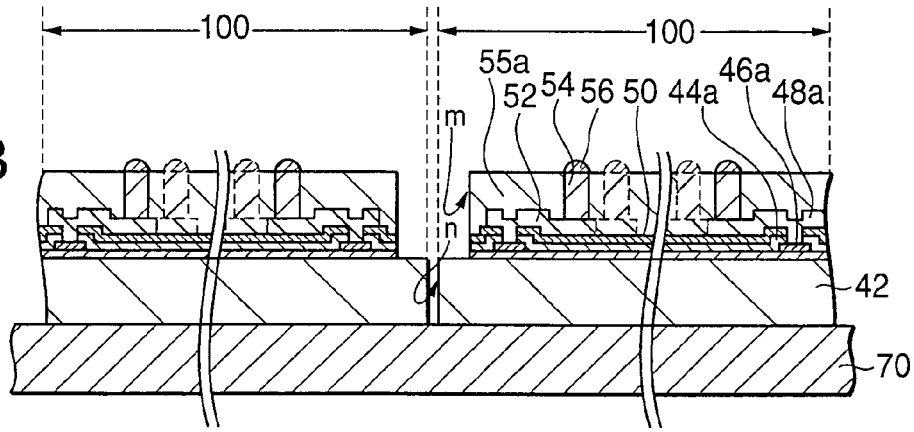

Thereafter, a peeling process for peeling away the respective cut WCSPs 100 from the dicing tape 70 is performed by a method similar to the first embodiment (see FIG. 7(B)).

Each of the so-peeled WCSPs 100 has a structure wherein a side end face m of each seal layer 55 is formed on the side inner than a side end face n of the silicon substrate 42. This results from the fact that the side end face m of the seal layer 55 corresponds to a cut cross-section formed by the blade, whereas the side end face n of the silicon substrate 42 corresponds to a cut cross-section formed by a crack formed based on each modified portion formed by irradiation of laser light.

In the present embodiment, the side end face m is formed on the side inner than the side end face n within a range of 5 µm to 100 µm in the case of cutting using a blade for providing a range of 50 µm to 200 µm as the interval between cut cross-sections and laser light for providing a range of 0.2 µm to 40 µm as the interval between cut cross-sections. More generally, in the case of cutting using a blade for providing a range of 35 µm to 100 µm as the interval between cut cross-sections, and laser light for providing a range of about 0.1 µm to 1.5 µm as the interval between cut cross-sections, the side end face m is formed on the side inner than the side end face n within a range of 10 µm to 75 µm.

As is apparent from the above description, the present embodiment is capable of obtaining an advantageous effect similar to the first embodiment.

Further, the smoothing of the surface of the silicon substrate and the thinning of the silicon substrate can be carried out together in the first grinding process of the present embodiment.

Therefore, the occurrence of a kerf width and pitching noticeable with respect to the thinned silicon substrate or the like can be suppressed in the dicing process.

Thus, according to the present embodiment, each of semiconductor devices having realized their thinning can be obtained with efficiency and stably.

Fifth Preferred Embodiment

A semiconductor device according to a fifth embodiment of the present invention and its manufacturing method will be explained with reference to FIGS. 8(A) through 8(C), which are respectively cross-sectional views similar to FIGS. 2(A) through 2(D), for describing the semiconductor device according to the present embodiment and its manufacturing method.

The present embodiment is principally different from the fourth embodiment in that a first grinding process is effected on each of second layers 47.

That is, the first grinding process executed in the present embodiment principally aims to remove electrode pads 46b and a seal layer 55b, which correspond to permeability resistant portions lying in a dicing area 62. In general, a silicon oxide film 44b and a passivation film 48b are used to serve as transparent portions for causing laser light to pass therethrough. However, the selective removal of the electrode pads 46b and the seal layer 55b are complex in practice. Further, the silicon oxide films 44b and passivation films 48b may preferably be removed simultaneously in consideration of much smoothness of the dicing area 62 and easiness of individualizing processing at the dicing process.

Figure 8A:
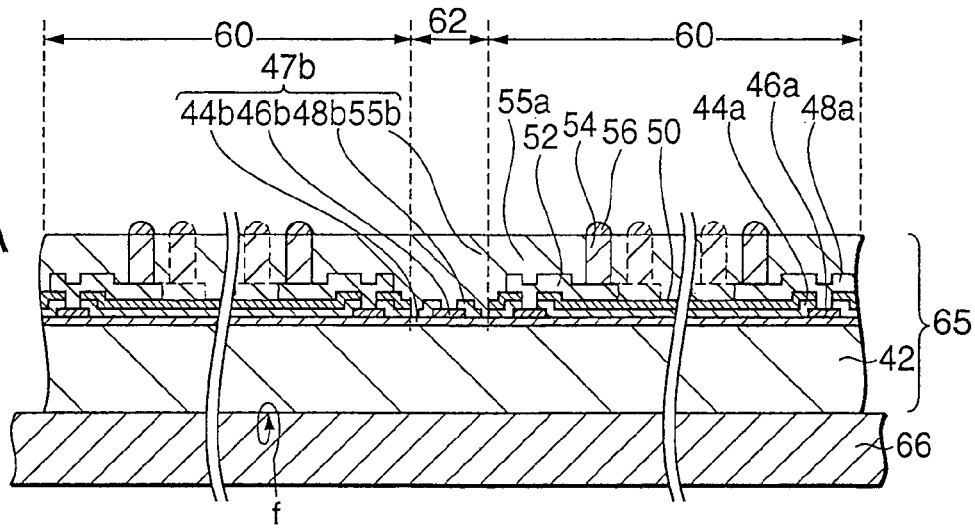
FIGS. 8(A) through 8(C) are process diagrams for describing a process for manufacturing a semiconductor device according to a fifth embodiment of the present invention.
Figure 8B:
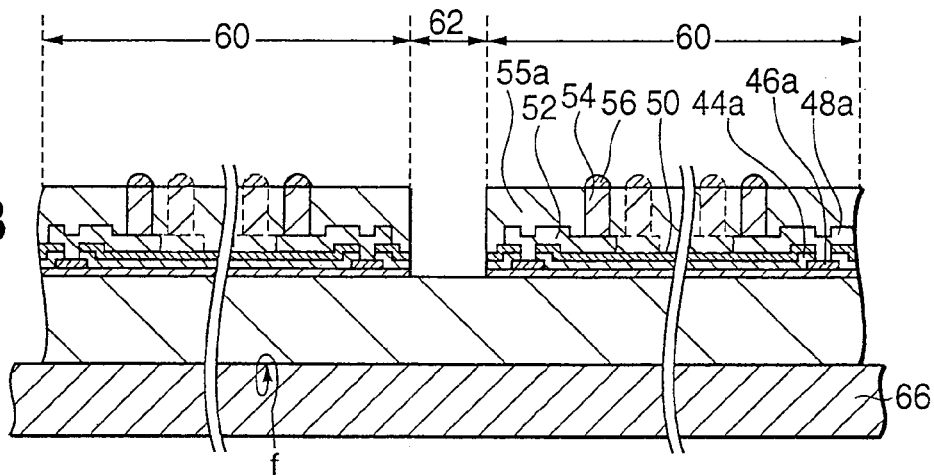

Therefore, as shown in FIG. 8(A), the back surface f of the silicon substrate 42 of the laminated body 65 described in the fourth embodiment is first fixed onto a dicing tape 66.

Thereafter, as the first grinding process, an outer peripheral portion of a blade (not shown) rotated at high speed is pressed against the seal layers 55 in the dicing area 62 and moved toward the silicon substrate 42 while predetermined pressure is being applied thereto along the dicing area 62. A cut-in depth of the blade at this time is gradually rendered deep so as to reach a depth at which the silicon substrate 42 is exposed. Thus, the silicon substrate 42 in the dicing area 62 is exposed (see FIG. 8(B)).

At this time, the cut-in depth of the blade may be set to such an extent that the surface layer of the silicon substrate 42 is slightly ground. Thus, the surface layer of the silicon substrate 42 can be smoothed as well as the removal of each second layer 47.

Afterwards, a non-fusion type dicing process is performed as a laser light-based dicing process by a method similar to the method described in the first embodiment.

Figure 8C:
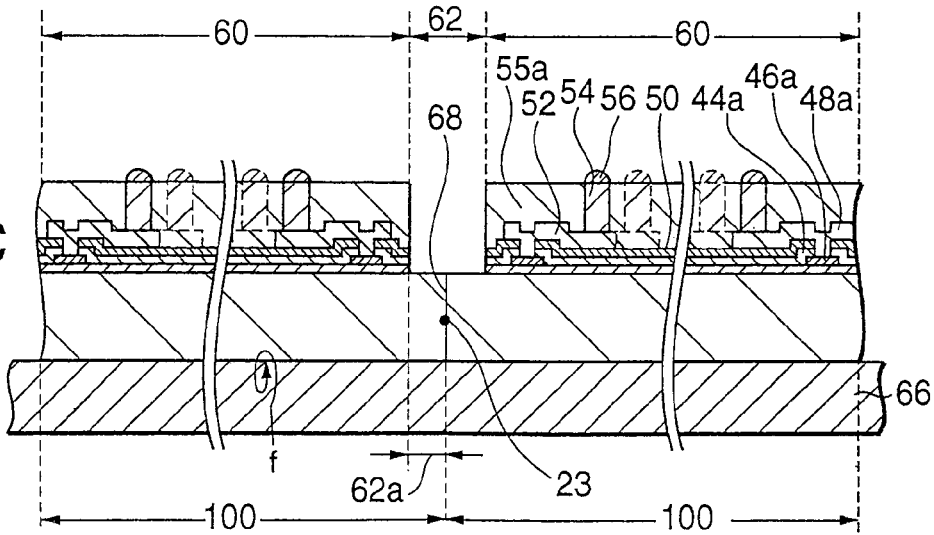

Even in the dicing process here, as already described, WCSPs 100 comprising WCSP effective areas 60 and dicing residual areas 62a can respectively be cut by using cracks 68 produced along modified portions formed in the dicing area 62 (see FIG. 8(C)).

Thereafter, a peeling process for peeling away the respective cut WCSPs 100 from the dicing tape 66 is performed in a manner similar to the fourth embodiment (see FIG. 7(B)).

In a manner similar to the fourth embodiment, each of the so-peeled WCSPs 100 also has a structure wherein a side end face m of each seal layer 55 is formed on the side inner than a side end face n of the silicon substrate 42. This results from the fact that the side end face m of the seal layer 55 corresponds to a cut cross-section formed by the blade, whereas the side end face n of the silicon substrate 42 corresponds to a cut cross-section formed by a crack formed based on each modified portion formed by irradiation of laser light.

Even in the present embodiment, the side end face m is formed on the side inner than the side end face n within a range of 5 μm to 100 μm in the case of cutting using a blade for providing a range of 50 μm to 200 μm as the interval between cut cross-sections and laser light for providing a range of 0.2 μm to 40 μm as the interval between cut cross-sections. More generally, in the case of cutting using a blade for providing a range of 35 μm to 100 μm as the interval between cut cross-sections, and laser light for providing a range of about 0.1 μm to 1.5 μm as the interval between cut cross-sections, the side end face m is formed on the side inner than the side end face n within a range of 1 μm to 75 μm.

As is apparent from the above description, the present embodiment is capable of obtaining an advantageous effect similar to the first embodiment.

Further, the present embodiment makes it unnecessary to provide a process step for temporarily peeling the laminated body subsequent to the completion of the dicing process from the dicing tape and thereafter re-fixing the laminated body onto a new dicing tape again. It is thus feasible to relax complication of the manufacturing process as compared with the fourth embodiment.

Incidentally, although not shown in the figure, the configuration using the SOS substrate described in the third embodiment may be adopted instead of the silicon substrate.

As mentioned above, the present invention is not limited to only the combinations of the above-described embodiments. Thus, the present invention is available by utilizing suitable conditions in combination at an arbitrary and suitable step.

For instance, the laser light-based non-heated processing type dicing method is not limited to the above-mentioned method alone. Accordingly, various laser light-based non-heated processing systems can be applied according to purposes and design.

Although the above embodiment has described, as the target to be processed, the wafer after the completion of the wafer process or the wafer prior to be individualized into WCSPs by way of example, the present invention is not limited to it. That is, the present invention is applicable to a target to be processed, which needs individualization by dicing. The shape of the target to be processed at this time is not limited to the circular form alone. The shape thereof may be rectangular, for example.

Although the ultraviolet curing acrylic resin has been used as the adhesive material for fixing the target to be processed in each of the aforementioned embodiments, it may be configured using wax or the like. Further, no limitation is imposed on fixing made by the sheet like the dicing tape. The adhesive material may be one using a fixing jig, for example.

According to the present invention, as apparent from the above description, a first grinding process that enables removal and smoothing of permeability resistant portions on a non-dicing surface of a target to be processed is performed as a pretreatment that performs dicing by laser light.

Thus, as compared with the case in which the first grinding process corresponding to the pretreatment is not performed, a reduction in the rate of convergence of the laser light due to scattering of the laser light can be suppressed even if the laser light is irregularly reflected on the surface of the target to be processed or the laser light penetrates up to the inside of the target.

As a result, the occurrence of a kerf width and pitching can be suppressed as compared with a dicing method using a blade as before, thus making it possible to realize a size reduction in semiconductor device.

While the preferred form of the present invention has been described, it is to be understood that modifications will be apparent to those skilled in the art without departing from the spirit of the invention. The scope of the invention is to be determined solely by the following claims.

What is claimed is:

1. A method of manufacturing a semiconductor device comprising:
   providing a substrate having effective chip areas, the chip areas being separated from each other by dicing areas, wherein the substrate has a first layer with a semiconductor element on the first layer, and a second layer on the first layer and covering the semiconductor element, the second layer including a post electrically connected to the semiconductor element in the effective chip area, a top surface of the post exposed from the second layer, wherein permeability of the second layer to laser light is lower than permeability of the first layer to laser light;
   grinding an entire surface of the first layer of the substrate;
   removing the second layer in the dicing areas; and
   applying laser light to the first layer of the ground substrate at the dicing areas, to cut the ground substrate into plural chips.

2. The method of manufacturing a semiconductor device of claim 1, wherein said applying laser light is a non-fusion process performed by converging the laser light inside the ground substrate.

3. The method of manufacturing a semiconductor device of claim 1, wherein the substrate is a silicon substrate.

4. The method of manufacturing a semiconductor device of claim 1, wherein the substrate includes a silicon thin film on a sapphire substrate.

5. The method of manufacturing a semiconductor device of claim 1, wherein the second layer includes a seal layer that seals the semiconductor element and the first layer.

6. The method of manufacturing a semiconductor device of claim 1, wherein the first layer of the substrate is ground during said grinding to have a thickness through which the laser light may pass, and the laser light is applied to the ground side of the first layer of the substrate.

7. A method of manufacturing a semiconductor device comprising:
   providing a substrate having effective chip areas, the chip areas being separated from each other by dicing areas, wherein the substrate has a first layer and a second layer on the first layer, the second layer including a semiconductor element formed on the first layer and a seal layer covering the semiconductor element, a permeability of the second layer to laser light is lower than a permeability of the first layer to laser light;
   fixing the second layer on a first elastic sheet;
   grinding the first layer of the substrate;
   applying laser light to the ground first layer of the substrate at the dicing areas, to cut the ground first layer of the substrate;
   removing the first elastic sheet;
   fixing the first layer on a second elastic sheet; and
   expanding the second elastic sheet to separate the cut substrate into plural chips.

8. The method of manufacturing a semiconductor device of claim 7, wherein said applying laser light is a non-fusion process performed by converging the laser light inside the ground substrate.

9. The method of manufacturing a semiconductor device of claim 7, wherein the substrate is a silicon substrate.

10. The method of manufacturing a semiconductor device of claim 7, wherein the substrate includes a silicon thin film on a sapphire substrate.

11. The method of manufacturing a semiconductor device of claim 7, wherein said grinding the first layer comprises:
    grinding an entire surface of the first layer to a first smoothness; and
    grinding the ground first layer to a second smoothness, the second smoothness being smoother than the first smoothness.

12. The method of manufacturing a semiconductor device of claim 7, wherein the first layer of the substrate is ground during said grinding to have a thickness through which the laser light may pass.

* * * * *